(12) United States Patent
Shao et al.

(10) Patent No.: US 12,356,666 B2
(45) Date of Patent: Jul. 8, 2025

(54) SEMICONDUCTOR STRUCTURE AND FABRICATION METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 592 days.

(21) Appl. No.: 17/893,201

(22) Filed: Aug. 23, 2022

(65) Prior Publication Data
US 2022/0406915 A1    Dec. 22, 2022

(30) Foreign Application Priority Data
Jun. 9, 2022   (CN) .......................... 202210653618.2

(51) Int. Cl.
*H10D 30/67* (2025.01)
*H10B 12/00* (2023.01)

(52) U.S. Cl.
CPC ......... *H10D 30/6735* (2025.01); *H10B 12/03* (2023.02); *H10B 12/053* (2023.02); *H10B 12/34* (2023.02); *H10B 12/482* (2023.02)

(58) Field of Classification Search
CPC ........... H10D 30/6735; H10D 30/6757; H10B 12/03; H10B 12/053; H10B 12/34; H10B 12/482; H10B 12/05; H10B 12/0335; H10B 12/038; H10B 12/0385; H10B 12/0387; H10B 12/39
See application file for complete search history.

(56) References Cited

U.S. PATENT DOCUMENTS

| | | | | |
|---|---|---|---|---|
| 8,742,493 B2* | 6/2014 | Kim | ..................... | H10D 30/025 257/302 |
| 8,912,604 B2* | 12/2014 | Myung | ................ | H10D 30/025 257/E51.011 |
| 9,691,773 B2* | 6/2017 | Surthi | .................. | H10B 12/488 |
| 11,189,624 B2* | 11/2021 | Jiang | ..................... | H10D 64/01 |
| 12,310,005 B2* | 5/2025 | Shao | .................... | H10B 12/482 |
| 2015/0357337 A1* | 12/2015 | Takaishi | ............... | H10D 64/017 257/334 |
| 2021/0257372 A1* | 8/2021 | Huang | ................. | H10D 64/666 |
| 2022/0093596 A1 | 3/2022 | Lavric et al. | | |

(Continued)

*Primary Examiner* — Eduardo A Rodela
(74) *Attorney, Agent, or Firm* — Kilpatrick Townsend & Stockton LLP (57) ABSTRACT

Embodiments provide a semiconductor structure and a fabrication method. The method includes: providing a substrate, the substrate being provided with a plurality of first trenches extending along a first direction and a plurality of second trenches extending along a second direction, and a depth of each of the plurality of first trenches being less than a depth of each of the plurality of second trenches; forming a first isolation structure to cover the substrate and fill the plurality of first trenches and the plurality of second trenches; forming a plurality of third trenches positioned in the substrate at bottoms of the plurality of first trenches and extending along the first direction; forming a second isolation structure to fill the plurality of first trenches and the plurality of third trenches; forming gate structures surrounding the substrate between the plurality of first trenches along the second direction.

20 Claims, 7 Drawing Sheets

(56) References Cited

U.S. PATENT DOCUMENTS

| 2023/0005919 | A1* | 1/2023 | Xiao | H10B 12/05 |
| 2023/0013070 | A1* | 1/2023 | Shao | H10B 12/482 |
| 2024/0349479 | A1* | 10/2024 | Tang | H10B 12/05 |

* cited by examiner

SEMICONDUCTOR STRUCTURE AND FABRICATION METHOD THEREOF

CROSS-REFERENCE TO RELATED APPLICATION

This application claims priority to Chinese Patent Application No. 202210653618.2, titled "SEMICONDUCTOR STRUCTURE AND FABRICATION METHOD THEREOF" and filed to the State Patent Intellectual Property Office on Jun. 9, 2022, the entire contents of which are incorporated herein by reference.

TECHNICAL FIELD

The present disclosure relates to the field of semiconductors, and more particularly, to a semiconductor structure and a fabrication method thereof.

BACKGROUND

As a dynamic memory develops towards a direction of higher integration density, when it is made a study of arrangement of transistors in a dynamic memory array structure, how to reduce a size of a single functional device in the dynamic memory array structure and improve electrical properties of the small-sized functional device is a problem to be solved urgently at present.

An example of a transistor device structure includes a planar structure, a fin field effect transistor (FinFET) structure, and a gate-all-around (GAA) structure. In the GAA structure, a gate structure completely surrounds a conductive channel, such that a transistor controls a current thereof to a maximum extent. However, in fabrication processes of the GAA structure, it is required to form the GAA structure for the transistor, which increases difficulty of fabricating a semiconductor structure, and puts forward higher requirements for increasing the integration density of the semiconductor structure.

SUMMARY

Embodiments of the present disclosure provide a semiconductor structure and a fabrication method thereof, to improve integration density of the semiconductor structure.

Embodiments of the present disclosure provide a method for fabricating a semiconductor structure, including: providing a substrate, the substrate being provided with a plurality of first trenches extending along a first direction and a plurality of second trenches extending along a second direction, and a depth of each of the plurality of first trenches being less than a depth of each of the plurality of second trenches; forming a first isolation structure to cover the substrate and fill the plurality of first trenches and the plurality of second trenches; forming a plurality of third trenches positioned in the substrate at bottoms of the plurality of first trenches and extending along the first direction; forming a second isolation structure to fill the plurality of first trenches and the plurality of third trenches; forming gate structures surrounding the substrate between the plurality of first trenches along the second direction, and in the first direction, projections of the gate structures and projections of the plurality of second trenches being parallel to one another and alternately arranged at intervals; forming conductive structures positioned in the plurality of second trenches, and in the first direction, the conductive structures being arranged at intervals in the plurality of second trenches.

The embodiments of the present disclosure also provide a semiconductor structure, which is fabricated by means of the method for fabricating a semiconductor structure according to the above embodiments. The semiconductor structure includes: a substrate, gate structures, conductive structures, a first isolation structure, and a second isolation structure. The substrate is provided with a plurality of first trenches extending along the first direction, a plurality of second trenches extending along the second direction, and a plurality of third trenches extending along the first direction, where a depth of each of the plurality of first trenches is less than a depth of each of the plurality of second trenches, and the plurality of third trenches are positioned in the substrate at the bottoms of the plurality of first trenches. The gate structures surround the substrate between the plurality of first trenches along the second direction, and in the first direction, projections of the gate structures and projections of the plurality of second trenches are parallel to one another and are alternately arranged at intervals. The conductive structures are positioned in the plurality of second trenches, and along the first direction, the conductive structures are arranged at intervals in the plurality of second trenches. The first isolation structure is configured to fill the plurality of first trenches and the plurality of second trenches between the gate structures and the conductive structures. The second isolation structure is configured to fill the plurality of first trenches and the plurality of third trenches between the gate structures and the conductive structures.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, it is difficult to increase integration density of a GAA semiconductor structure.

Based on analysis, it is found that reasons for the above problems are as below. In the GAA structure, a gate structure completely surrounds a conductive channel, to control current thereof to a maximum extent. Moreover, arrangement of the gate surrounding the channel region in the GAA structure may increase the integration density of the semiconductor structure. However, in fabrication processes of the GAA structure, it is required to form the GAA structure for the transistor, which increases difficulty of fabricating the semiconductor structure, and puts forward higher requirements for further increasing the integration density of the semiconductor structure.

An embodiment of the present disclosure provides a method for fabricating a semiconductor structure, which may be configured for fabricating the GAA structure and may be applied to a memory, such as a dynamic random access memory (DRAM), a static random access memory (SRAM), or a read only memory (ROM), to improve the integration density of semiconductor structure.

The embodiments of the present disclosure will be described in detail below in conjunction with the accompanying drawings. However, a person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments.

Figure 4:
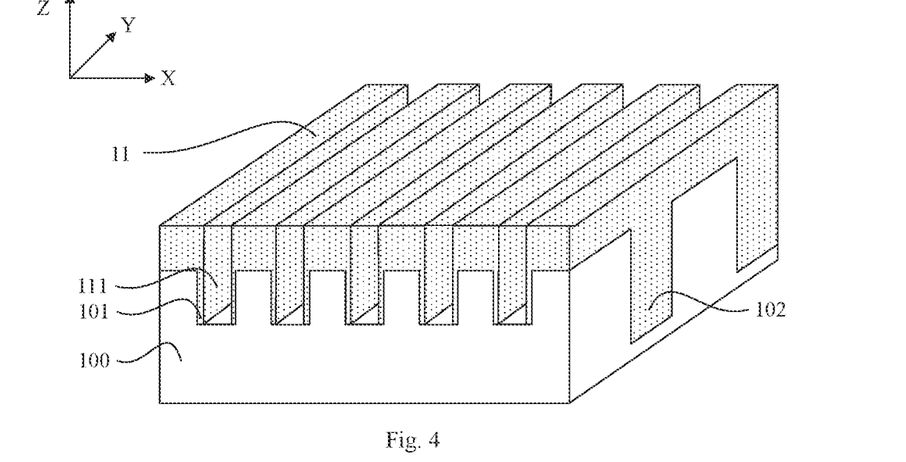
Figure 5:
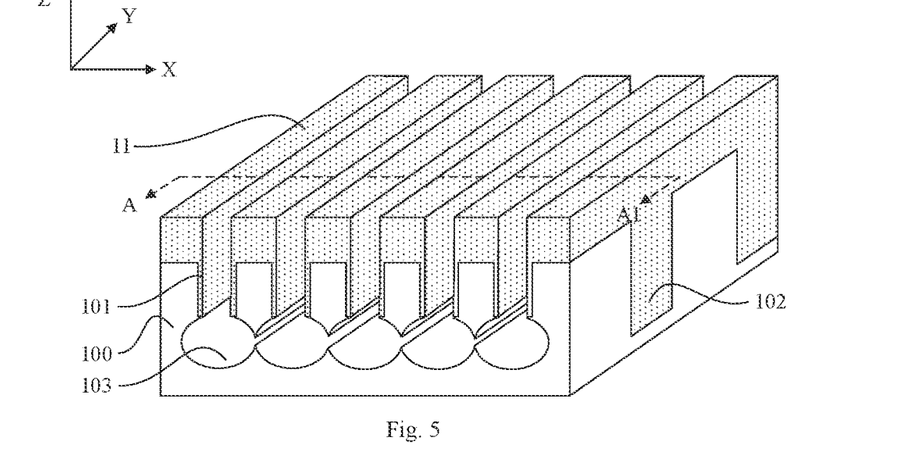
Figure 6:
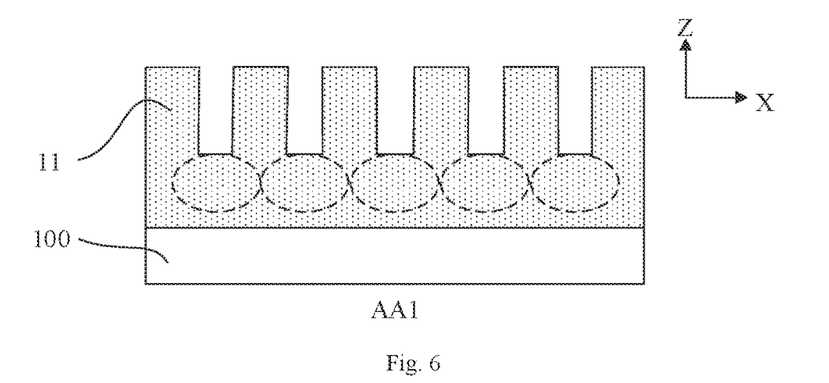
Figure 7:
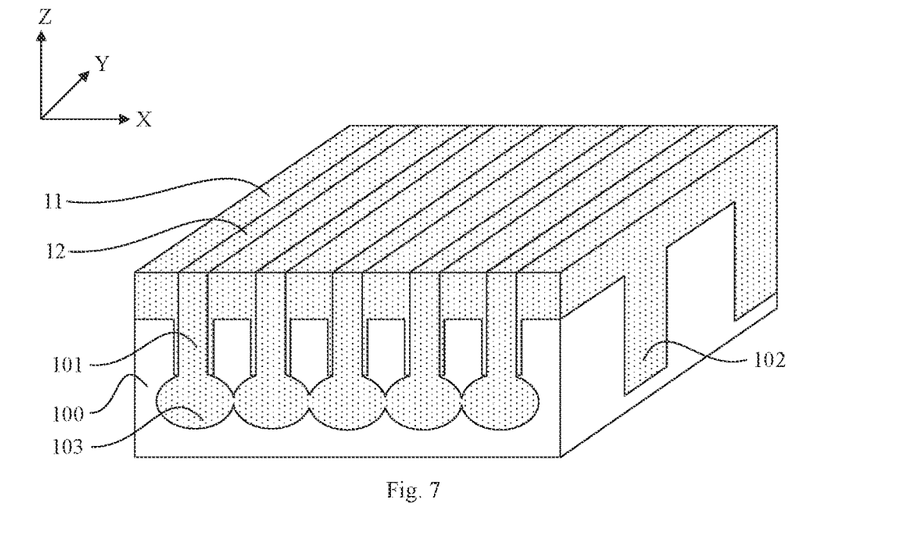
Figure 8:
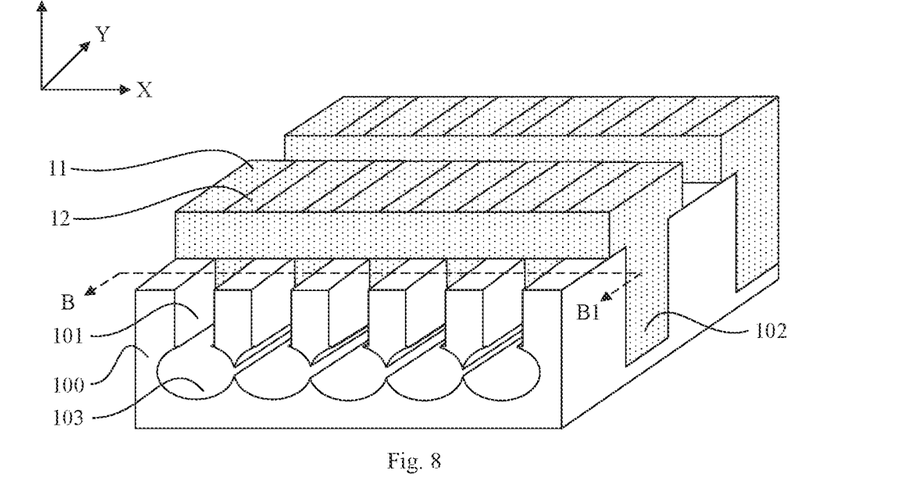
Figure 9:
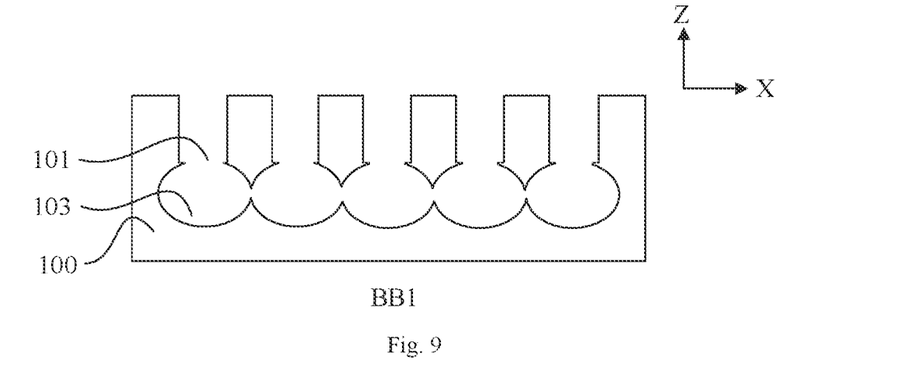
Figure 10:
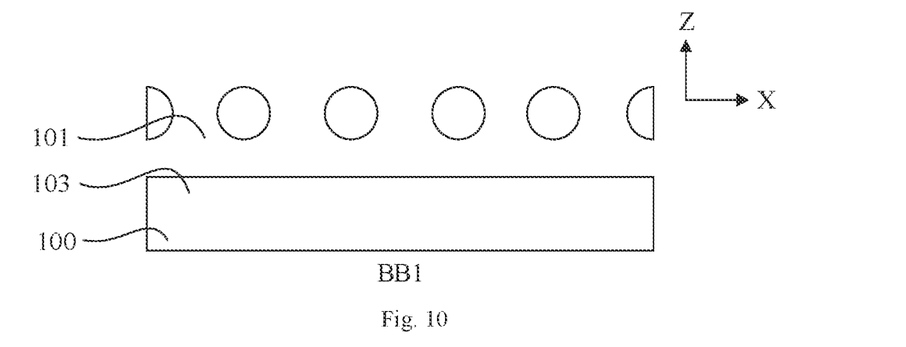
Figure 11:
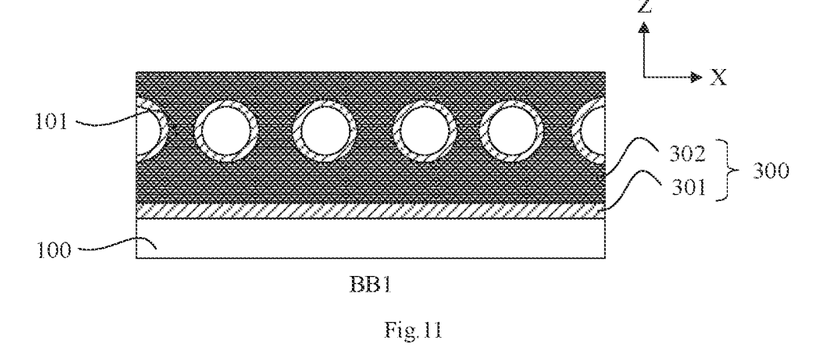
Figure 13:
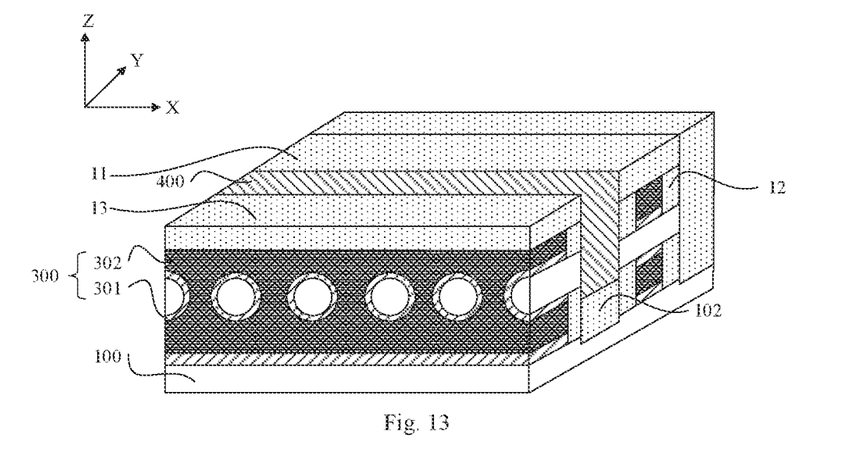
Figure 14A:
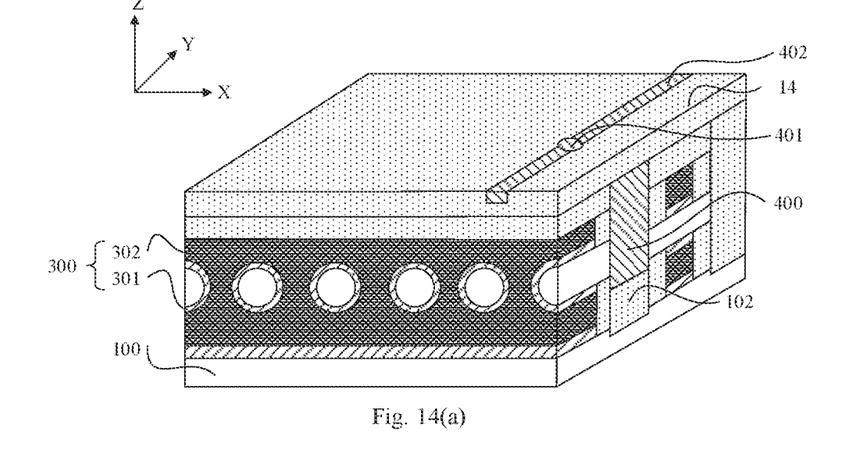
Figure 14B:
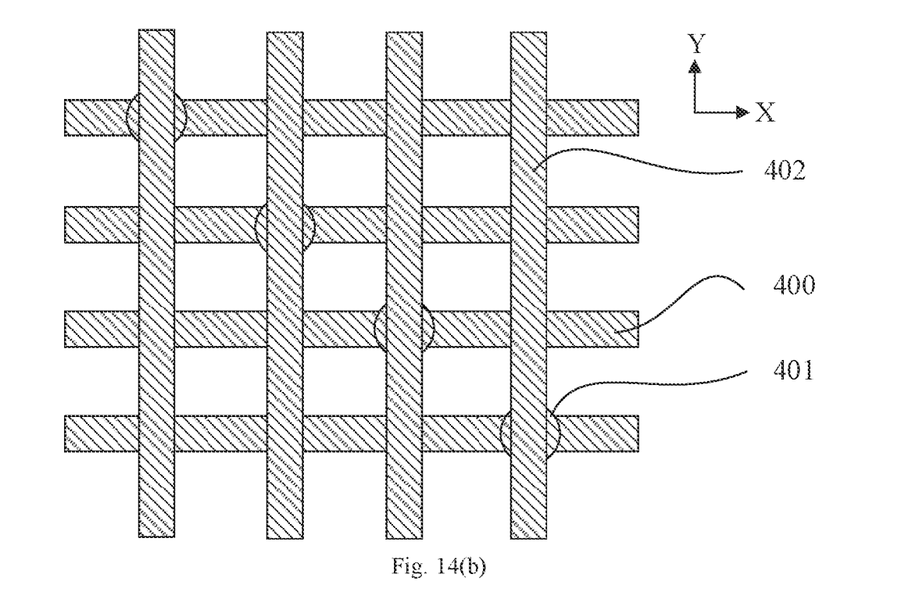

FIGS. 1 to 15 are schematic structural diagrams corresponding to steps of the method for fabricating a semiconductor structure provided by this embodiment, where FIG. 6 is a schematic cross-sectional structural diagram of FIG. 5 along an AA1 direction, FIGS. 9 to 11 are schematic cross-sectional structural diagrams of FIG. 8 along a BB1 direction, and FIG. 14(*b*) is a schematic structural diagram showing a correspondence relationship between conductive structures, bit line contact lines and bit line extension lines in FIG. 14(*a*). The method for fabricating a semiconductor structure provided by this embodiment will be described in detail below with reference to the accompanying drawings.

The method for fabricating a semiconductor structure includes following steps.

Figure 1:
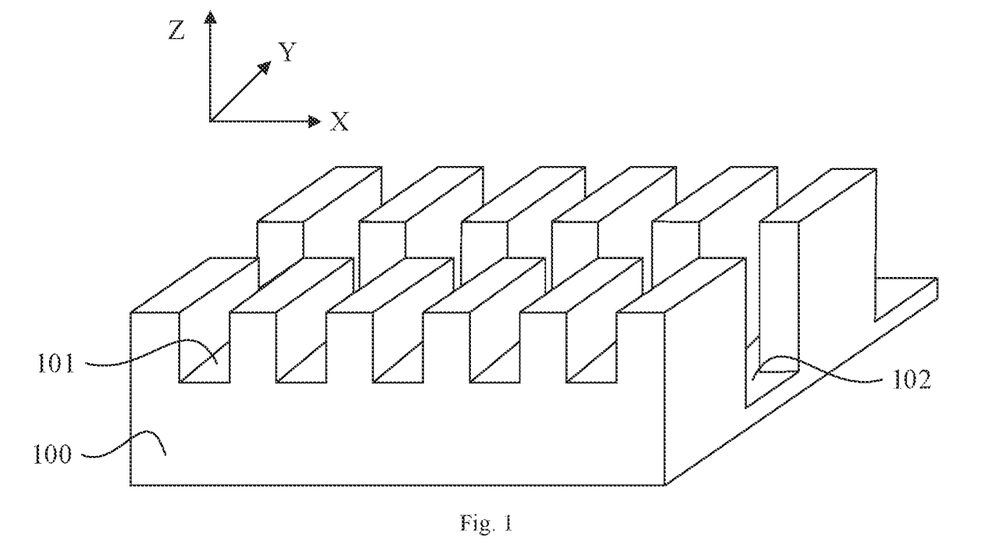
FIGS. 1 to 15 are schematic structural diagrams corresponding to steps of a method for fabricating a semiconductor structure according to an embodiment of the present disclosure.

Referring to FIG. 1, a substrate 100 is provided, on which a plurality of first trenches 101 extending along a first direction Y and a plurality of second trenches 102 extending along a second direction X are provided. A depth of each of the plurality of first trenches 101 is less than a depth of each of the plurality of second trenches 102, where an angle between the first direction Y and the second direction X is greater than 0°.

For the substrate 100, a material of the substrate 100 may be an elemental semiconductor material or a crystalline inorganic compound semiconductor material. The elemental semiconductor material may be silicon or germanium; and the crystalline inorganic compound semiconductor material may be silicon carbide, silicon germanium, gallium arsenide, or indium gallium, etc.

It should be noted that, in this embodiment, the angle between the first direction Y and the second direction X is 90°, and in other embodiments, the angle between the first direction Y and the second direction X may be 45°, 60°, or 80°. This embodiment does not constitute a limitation on the angle between the first direction Y and the second direction X.

Figure 2:
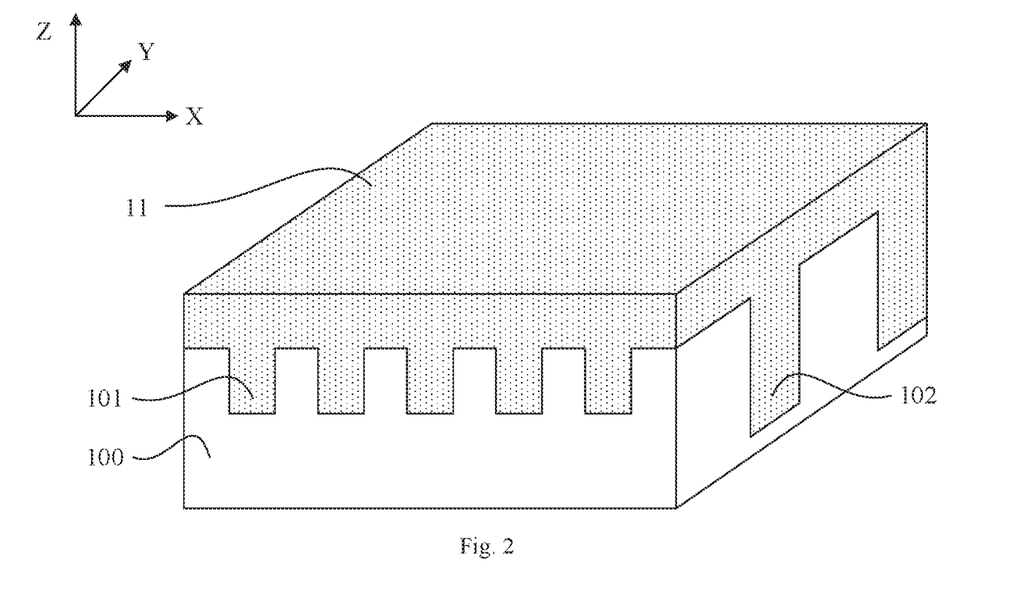

Referring to FIG. 2, a first isolation structure 11 is formed to cover the substrate 100 and fill the first trenches 101 and the second trenches 102.

For the first isolation structure 11, a material for forming the first isolation structure 11 may be an insulating material such as silicon oxide, silicon nitride, and silicon oxynitride.

Figure 3:
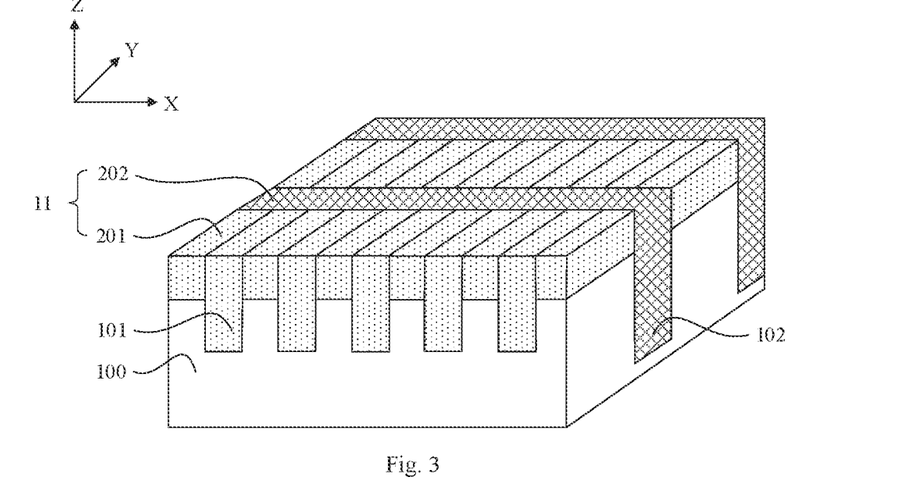

In some embodiments, referring to FIG. 3, the step of forming the first isolation structure 11 comprises: forming a first spacer 201, the first spacer 201 filling the plurality of first trenches 101 and covering a top surface of the substrate 100; and forming a second spacer 202, the second spacer 202 filling the plurality of second trenches 102, and a top surface of the second spacer 202 being flush with a top surface of the first spacer 201.

For the first spacer 201 and the second spacer 202, a material for forming the first spacer 201 and a material for forming the second spacer 202 may be insulating materials such as silicon oxide, silicon nitride, or silicon oxynitride. In this embodiment, the material for forming the first spacer 201 is the same as the material for forming the second spacer 202, and the following figures are represented by the same filling. In other embodiments, the material for forming the first spacer 201 may be different from the material for forming the second spacer 202.

In some embodiments, a process of forming the first spacer 201 and the second spacer 202 may be a deposition process, which may be a chemical vapor deposition process, a physical vapor deposition process, an atomic layer deposition process, or the like.

In some other embodiments, a method of providing a substrate and forming a first isolation structure includes: providing a substrate and forming a first spacer, where the first spacer covers a surface of the substrate; patterning the first spacer and part of the substrate to form a first trench, and filling the first spacer in the first trench; patterning the first spacer and part of the substrate to form a second trench, and filling a second spacer in the second trench. A top surface of the second spacer is flush with that of the first spacer, and the first spacer and the second spacer together constitute the first isolation structure. The first spacer is first formed on the surface of the substrate, which can protect the surface of the substrate from contamination or damage during the process of patterning the first spacer and the substrate, thereby preventing performance of the semiconductor structure from being adversely affected.

A plurality of third trenches are formed, where the plurality of third trenches are positioned in the substrate 100 at bottoms of the first trenches and extend along the first direction.

In some embodiments, referring to FIG. 4 and FIG. 5, a method of forming the third trenches includes following steps. Referring to FIG. 4, part of the first isolation structure 11 is patterned to form an etching opening 111, where the etching opening 111 is positioned in the first isolation structure 11 of the first trench 101, and in the first direction Y, a size of the etching opening 111 is smaller than or equal to that of the first trench 101. Referring to FIG. 5, part of the substrate 100 is removed on a basis of the etching opening 111 to form a plurality of third trenches 103 extending along the first direction Y and positioned in the substrate 100 at the bottoms of the first trenches 101. Tops of the third trenches 103 communicate with bottoms of the first trenches 101, and in the second direction X, adjacent third trenches 103 communicate with each other. It should be noted that the third trench 103 is positioned in the substrate 100 at the bottom of the first trench 101. Referring to FIG. 6, that is, in the first direction Y, the second trench 102 cuts off the third trench 103, and the first isolation structures 11 positioned in the second trench 102 may be used as a support structure to prevent collapse of a remaining part of the substrate 100 between the first trenches 101 from causing damage to the semiconductor structure.

It is to be understood that, the etching openings 111 in the first direction Y are smaller than or greater than the first trenches 101 in size, and the first isolation structure 11 on the surface of part of the substrate 100 on side walls of the first trenches 101 may be retained, such that in the process of subsequently forming the third trenches 103 by means of etching, the surface of the part of the substrate 100 on the side walls of the first trenches 101 is not polluted or worn, thereby improving stability of the semiconductor structure. A transistor having a GAA structure may be formed in the subsequent process on the basis of a remaining part of the substrate 100 between the first trenches 101 and the third trenches 103, to increase the contact area between the channel region of the transistor and the gate structure, thereby improving capability of the transistor in the semiconductor structure in controlling current, and thus improving the performance of the semiconductor structure. Moreover, the GAA structure may form a three-dimensional transistor structure to increase the integration density of the semiconductor structure.

In some embodiments, the process of forming the etching opening 111 and removing part of the substrate 100 may be an etching process, which may be dry etching or wet etching.

Referring to FIG. 7, a second isolation structure 12 is formed to fill the first trench 101 and the third trench 103, and a top surface of the second isolation structure 12 is flush with that of the first isolation structure 11.

For the second isolation structure 12, a material for forming the second isolation structure 12 may be an insulating material such as silicon oxide, silicon nitride, and silicon oxynitride. In this embodiment, the material for forming the second isolation structure 12 is the same as the material for forming the first isolation structure 11. In other embodiments, the material for forming the second isolation structure 12 may be different from the material for forming the first isolation structure 11.

In some embodiments, the process for forming the second isolation junction 12 may be a deposition process, which may adopt a chemical vapor deposition process, a physical vapor deposition process, an atomic layer deposition process, or the like.

Gate structures are formed, where the gate structures surround the substrate between the first trenches along the second direction, and in the first direction, projections of the gate structures and projections of the second trenches are parallel to one another and are alternately arranged at intervals.

In some embodiments, the step of forming the gate structures includes: referring to FIG. 8, removing the first isolation structure 11 and the second isolation structure 12 along the second direction X to form channel regions. The channel regions expose the surface of the substrate 100 in the first trenches 101 and the third trenches 103 in the second direction X. In the first direction Y, the channel regions, a remaining part of the first isolation structure 11 and a remaining part of the second isolation structure 12 are alternately arranged, and projections of the channel regions on the substrate 100 and projections of the second trenches 102 on the substrate 100 are parallel to one another and are alternately arranged at intervals.

In some embodiments, the method for forming the channel regions may include: forming a mask layer along the second direction, where the mask layer covers the top surface of the first isolation structure and the top surface of the second isolation structure above the second trenches, and the mask layer is wider than the second trenches; and removing the first isolation structure and the second isolation structure beyond the mask layer along the second direction, to expose the surface of the substrate to form the channel regions, and removing the mask layer.

For the mask layer, in some embodiments, a material of the mask layer may be SiN, SiCN, or SiOCN. In some other embodiments, the material of the mask layer may be photoresist, and a region that needs to be covered by the mask layer is defined on the basis of an exposure range of the photoresist.

In some embodiments, the method for removing the first isolation structure and the second isolation structure beyond the mask layer along the second direction to expose the surface of the substrate to form the channel regions may be an etching process, which may by dry etching or wet etching.

Further, referring to FIG. 9 and FIG. 10, after forming the channel regions and before forming the gate structures, the method may further include: rounding a remaining part of the substrate 100 between the first trenches 101, such that a shape of the remaining part of the substrate 100 exposed between the first trenches 101 conforms to a preset pattern. Referring to FIG. 9, after the first isolation structure 11 and the second isolation structure 12 in the first trenches 101 and the third trenches 103 are removed, the surface of the remaining part of the substrate 100 forms a tip, and the tip may cause tip discharge or leakage in the formed gate structure, which has a negative effect on the performance of the semiconductor structure. Referring to FIG. 10, after the rounding treatment, the surface of the substrate 100 is smoothly transited, which is beneficial to avoiding occurrence of the tip discharge or leakage in the gate structure formed in the channel regions, and further improving the electrical properties of the semiconductor structure.

It should be noted that, in this embodiment, the preset pattern is a cylinder shape; and in other embodiments, the preset pattern may also be an elliptic cylinder shape, a polygon prism shape, or other irregular shapes. It is to be understood that, when the preset pattern is the polygon prism shape, a corner formed by adjacent surfaces of side walls of the polygon prism shape may be a smoothened corner, and can also avoid the tip discharge. The polygon prism shape may be a cubic columnar structure or a cuboid columnar structure.

In some embodiments, the rounding treatment is implemented on the basis of a thermal oxidation process, an etching process, and/or a hydrogen annealing treatment process.

In some embodiments, with continued reference to FIG. 10, after forming the channel regions and before forming the gate structures, the method further comprises: planarizing the substrate 100 at bottoms of the channel regions. It is to be understood that, the third trenches 103 are communicated with one another along the second direction X, and the substrate 100 at the bottoms of the third trenches 103 easily forms a tip, thereby causing the tip discharge or leakage in the gate structures formed in the channel regions. Therefore, planarizing the substrate 100 at the bottoms of the channel regions may improve the electrical properties of the semiconductor structure. It should be noted that, in this embodiment, planarizing the substrate 100 at the bottoms of the channel regions makes the surface of the substrate 100 at the bottoms of the channel regions flat and smooth. In other embodiments, planarizing the substrate 100 at the bottoms of the channel regions may only smoothen the tip. This embodiment does not limit the shape of the planarization treatment.

Referring to FIG. 11, the channel regions are filled to form the gate structures. In some embodiments, the forming the gate structures 300 includes: forming a gate dielectric layer 301, where the gate dielectric layer 301 surrounds the surface of the remaining part of the substrate 100 between the first trenches 101 in the channel regions and also covers the substrate 100 at the bottoms of the third trenches 103, that is, the gate dielectric layer 301 covers the surface of the substrate 100 in the channel regions; and forming a gate conductive layer 302, where the gate conductive layer 302 fills voids between the substrate 100 in the channel regions. The gate dielectric layer 301 covers the surface of the substrate 100 between the first trenches 101, and also covers the surface of the substrate 100 at the bottoms of the third trenches 103, which may prevent the gate conductive layer 302 from reacting with the substrate 100 in the subsequent process, thereby preventing causing damage to the semiconductor structure.

For the gate dielectric layer 301, a material for forming the gate dielectric layer 301 includes at least one of silicon oxide, silicon nitride, or silicon oxynitride.

For the gate conductive layer 302, a material for forming the gate conductive layer 302 includes at least one of polysilicon, titanium nitride, titanium aluminide, tantalum nitride, tantalum, copper, aluminum, lanthanum, copper, or tungsten.

In some embodiments, the process for forming the gate dielectric layer 301 and the gate conductive layer 302 may be a deposition process, which may adopt a chemical vapor deposition process, a physical vapor deposition process, an atomic layer deposition process, or the like.

Figure 12:
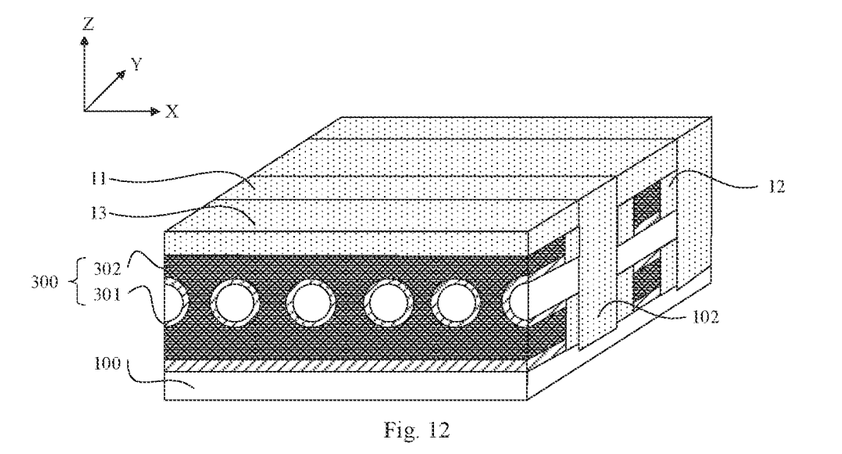

Further, referring to FIG. 12, in some embodiments, after forming the gate structure 300, the method may further include: forming a third isolation structure 13, where the third isolation structure 13 covers the surface of the gate structure 300, and a top surface of the third isolation structure 13 is flush with that of the first isolation structure 11. The third isolation structure 13 covers the surfaces of the gate structures 300, such that the gate structures 300 may be protected from being polluted or damaged in the subsequent process, and the performance of the semiconductor structure is prevented from being adversely affected. Moreover, the third isolation structure 13 may isolate different devices from each other, thereby avoiding causing damage to the semiconductor structure due to conduction between the devices. The top surface of the third isolation structure 13 is flush with that of the first isolation structure 11, which may avoid a height difference between the first isolation structure 11 and the third isolation structure 13, thereby preventing having a negative effect on the subsequent process.

For the third isolation structure 13, a material for forming the third isolation structure 13 may be an insulating material such as silicon oxide, silicon nitride, and silicon oxynitride. In this embodiment, the material for forming the third isolation structure 13 is the same as the material for forming the first isolation structure 11. In some other embodiments, the material for forming the third isolation structure 13 may be different from the material for forming the first isolation structure 11.

In some embodiments, the process of forming the third isolation structure 13 may be a deposition process, which may adopt a chemical vapor deposition process, a physical vapor deposition process, or an atomic layer deposition process, etc.

Referring to FIG. 13, conductive structures 400 are formed, where the conductive structures 400 are positioned in the second trenches 102, and in the first direction Y, the conductive structures 400 are arranged in the second trenches 102 at intervals.

In some embodiments, the step of forming the conductive structures includes: patterning the first isolation structure and the second isolation structure to expose the second trenches with a partial height at intervals in the first direction; filling the second trenches to form the conductive structure, where in the first direction, the conductive structures are arranged in the second trenches at intervals. The second trenches 102 are exposed at intervals along the first direction Y to form the conductive structures 400, and the same conductive structure 400 may be connected to a remaining part of the substrate 100 between adjacent two rows of first trenches 101. That is, bit line structures formed by the same conductive structure 400 may be coupled to adjacent two rows of transistors, thereby reducing arrangement of the bit line structures, such that the semiconductor structure can be further miniaturized, thereby increasing the integration density of the semiconductor structure, simplifying the processes for fabricating the semiconductor structure, and improving the fabrication efficiency of the semiconductor structure.

In some embodiments, the material for forming the conductive structures 400 includes at least one of metal silicide, copper, or tungsten. In some other embodiments, the material for forming the conductive structure 400 may be a single metal, a metal compound or an alloy. The single metal may be copper, aluminum, tungsten, gold, or silver, etc. the metal compound may be tantalum nitride or titanium nitride. The alloy may be an alloy material comprising at least two of copper, aluminum, tungsten, gold, or silver. The conductive structures 400 is made of a metal material, such that the conductive structures 400 may have a lower resistivity, which is advantageous to reducing resistance of the conductive structures 400, increasing a transmission rate of an electrical signal in the conductive structures 400, reducing a parasitic capacitance of the conductive structures 400, and reducing heat loss to reduce power consumption.

Further, referring to FIG. 14(*a*), in some embodiments, after forming the conductive structures 400, the method further includes: forming a fourth isolation structure 14, where the fourth isolation structure 14 covers a surface of the first isolation structure 11, a surface of the second isolation structure 12, and surfaces of the conductive structures 400; and forming a plurality of bit line contact lines 401, where the plurality of bit line contact lines 401 are positioned in the fourth isolation structure 14 and extend along a third direction Z. each of the plurality of bit line contact lines 401 has one end connected to the conductive structures 400 and other end connected to bit line extension lines 402, where the bit line extension lines 402 are positioned in the fourth isolation structure 14 and extend along the first direction Y. An angle between the third direction Z and a plane where the first direction Y and the second direction X are positioned is greater than 0°. In this embodiment, the angle between the third direction Z and the plane where the first direction Y and the second direction X are positioned is 90°. In other embodiments, the angle between the third direction Z and the plane where the first direction Y and the second direction X are positioned may be 60° or 45°, and this embodiment does not constitute a limitation to the angle between the third direction Z and the plane where the first direction Y and the second direction X are positioned.

By means of bit line contact lines 401 and bit line extension lines 402, the conductive structures 400 extending along the second direction X may be changed to extend along the first direction Y, such that the gate structures 300 and the conductive structures 400 have different extension directions, thereby avoiding mutual influence between the gate structures 300 and the conductive structures 400 in the subsequent process, and preventing the semiconductor structure from becoming complicated. It should be noted that, referring to FIG. 14(*b*), which is a schematic structural diagram showing a correspondence relationship between the conductive structures 400, the bit line contact lines 401 and the bit line extension lines 402. Each of the conductive structures 400 only needs to be connected to one group of bit line contact lines 401 and bit line extension lines 402. It is to be understood that, along the second direction X, two rows of transistors may share one conductive structure 400. By forming one group of bit line contact lines 401 and bit line extension lines 402, it may implemented that one bit line extension line 402 is coupled to a plurality of transistors in contact with the corresponding conductive structure 400.

For the bit line contact lines 401 and the bit line extension lines 402, materials for forming the bit line contact lines 401 and the bit line extension lines 402 may be at least one of metal silicide, copper or tungsten. In some other embodiments, the materials for forming the bit line contact lines 401 and the bit line extension lines 402 may be a single metal, a metal compound or an alloy. The single metal may be copper, aluminum, tungsten, gold, or silver, etc. the metal compound may be tantalum nitride or titanium nitride. The alloy may be an alloy material comprising at least two of copper, aluminum, tungsten, gold, or silver.

In some embodiments, the material for forming the bit line contact lines 401 may be the same as the material for forming the conductive structures 400, and the material for forming the bit line extension lines 402 may be the same as the material for forming the conductive structures 400. In some other embodiments, the material for forming the bit line contact lines 401 may be different from the material for forming the conductive structures 400, and the material for forming the bit line extension lines 402 may be different from the material for forming the conductive structures 400.

Figure 15:
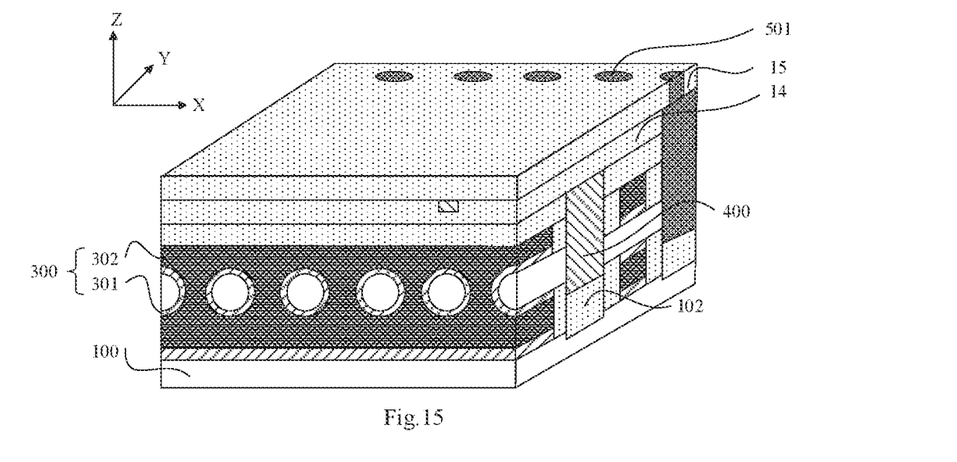

Still further, referring to FIG. 15, in some embodiments, after forming the conductive structure 400, the method further includes: forming capacitor contact spacers 15, where the capacitor contact spacers 15 cover a surface of the fourth isolation structure 14 and surfaces of the bit line extension lines 402; removing part of the first isolation structure 11 positioned in the second trench 102 by part of height to form capacitor contact structures 501, where the capacitor contact structures 501 extend along the third direction Z, and the capacitor contact structures 501 and the conductive structures 400 are alternately arranged in the first direction Y; and forming capacitor structures on the capacitor contact structures 501. By means of the capacitor contact structures 501, the capacitor structures on the surfaces of capacitor contact spacers 15 may be coupled to the transistors. Moreover, on the surfaces of the capacitor contact spacers 15, the capacitor structures may be in a hexagonal closest-packed arrangement to increase the space utilization of the semiconductor structure, thereby increasing the integration density of the semiconductor structure.

In some embodiments, a material for forming the capacitor contact structures 501 may be at least one of metal silicide, titanium, tantalum, copper, polysilicon, tungsten, tantalum nitride, titanium nitride or ruthenium.

In some other embodiments, the process for forming the capacitor contact structures and the process for forming the conductive structures may be performed simultaneously. In some embodiments, the first isolation structure and the second isolation structure are patterned to expose the second trenches. The conductive structures and the capacitor contact structures are formed to fill the second trenches, and in the first direction, the conductive structures and the capacitor contact structures are alternately arranged, where each of the capacitor contact structures corresponds to one transistor. In this way, the fabrication steps of the conductive structures and the capacitor contact structures may be reduced, thereby simplifying the fabrication processes of the semiconductor structure, and improving the fabrication efficiency of the semiconductor structure.

According to the method for fabricating a semiconductor structure provided by the embodiments of the present disclosure, a plurality of first trenches 101 extending along the first direction Y, a plurality of second trenches 102 extending along the second direction X and a plurality of third trenches 103 extending the first direction Y are formed. In the second direction X, the gate structures 300 are formed on the substrate 100 surrounding the first trenches 101 and the third trenches 103. In the first direction Y, the conductive structures 400 positioned in the second trenches 102 are formed at intervals. In this way, the gate structures 300 surrounds the substrate 100 to form a transistor having the GAA gate structures 300, thereby increasing a contact area between the channel regions of the transistor, improving capability of the transistor in controlling the current, and improving service performance of the semiconductor structure and increasing the integration density of the semiconductor structure. Along the second direction X, adjacent two rows of transistors are commonly connected to the same conductive structure 400. That is, the two rows of transistors share the same bit line, such that space utilization of the semiconductor structure may be increased. In this way, the integration density of the semiconductor structure is further increased, and processes for forming the bit line of the semiconductor structure may also be simplified.

Another embodiment of the present disclosure provides a semiconductor structure, which is fabricated by means of the above method for fabricating a semiconductor structure, to improve the performance of the semiconductor structure formed. It should be noted that reference may be made to the detailed description of the foregoing embodiment for the same or corresponding parts as the previous embodiment, which is not described again herein.

With continued reference to FIG. 13, the semiconductor structure provided by this embodiment includes:

a substrate 100, gate structures 300, conductive structures 400, a first isolation structure 11, and a second isolation structure 12. The substrate 100 is provided with a plurality of first trenches 101 extending along the first direction Y, a plurality of second trenches 102 extending along the second direction X, and a plurality of third trenches 103 extending along the first direction Y, where a depth of each of the plurality of first trenches 101 is less than a depth of each of the plurality of second trenches 102, and the plurality of third trenches 103 are positioned in the substrate 100 at the bottoms of the plurality of first trenches 101. The third trenches 103 are positioned in the substrate 100 at the bottoms of the first trenches 101. Tops of the third trenches 103 communicate with bottoms of the first trenches 101, and in the second direction X, adjacent third trenches 103 communicate with each other. The gate structures 300 are positioned in the first trenches 101 and the third trenches 103 and surround the substrate 100 between the plurality of first trenches 101 along the second direction X, and in the first direction Y, projections of the gate structures 300 and projections of the plurality of second trenches 102 are parallel to one another and are alternately arranged at intervals. The conductive structures 400 are positioned above the first isolation structure 11 in the plurality of second trenches 102, and along the first direction Y, the conductive structures 400 are arranged at intervals in the plurality of second trenches 102. The first isolation structure 11 is configured to fill the plurality of first trenches 101 and the plurality of second trenches 102 between the gate structures 300 and the conductive structures 400. The second isolation structure 12 is configured to fill the plurality of first trenches 101 and the plurality of third trenches 103 between the gate structures 300 and the conductive structures 400.

For the substrate 100, a material of the substrate 100 may be an elemental semiconductor material or a crystalline inorganic compound semiconductor material. The elemental semiconductor material may be silicon or germanium; and the crystalline inorganic compound semiconductor material may be silicon carbide, silicon germanium, gallium arsenide, or indium gallium, etc.

For the first isolation structure 11 and the second isolation structure 12, materials of the first isolation structure 11 and of the second isolation structure 12 may be insulating materials such as silicon oxide, silicon nitride, and silicon oxynitride. In some embodiments, the material of the first isolation structure 11 is different from the material of the second isolation structure 12. In some other embodiments, the material of the first isolation structure 11 is the same as the material of the second isolation structure 12. The first isolation structure 11 and the second isolation structure 12 are positioned between the gate structures 300 and the conductive structures 400, to isolate the transistors comprising the gate structures 300 and the conductive structures 400, such that performance degradation of the semiconductor structure caused by mutual conduction between different transistors may be prevented, thereby increasing the stability of the semiconductor structure and improving the service performance of the semiconductor structure.

With continued reference to FIG. 13, in some embodiments, the gate structure 300 includes: a gate dielectric layer 301 covering the surface of the substrate 100 in the first trench 101 and the third trench 103; and a gate conductive layer 302 covering a surface of the gate dielectric layer 301 and filling the first trench 101 and the third trench 103. The gate structures 300 are arranged around the channel region, and along the second direction X, transistors in the same row share the same gate structure 300, which simplifies the fabrication processes of the semiconductor structure and improves the integration density of the semiconductor structure. Furthermore, the gate-all-around gate structures increases the contact area between the channel regions of the transistors, and improves capability of the transistors in controlling the current, thereby improving the service performance of the semiconductor structure.

For the gate dielectric layer 301, a material of the gate dielectric layer 301 includes at least one of silicon oxide, silicon nitride or silicon oxynitride.

For the gate conductive layer 302, a material of the gate conductive layer 302 includes at least one of polysilicon, titanium nitride, titanium aluminide, tantalum nitride, tantalum, copper, aluminum, lanthanum, or tungsten.

Referring to FIG. 14(a), in some embodiments, the semiconductor structure further includes: a fourth isolation structure 14 covering the surface of the first isolation structure 11, the surface of the second isolation structure 12 and the surfaces of the conductive structures 400; a plurality of bit line contact lines 401 positioned in the fourth isolation structure 14 and extending along the third direction Z. Each of the plurality of bit line contact lines 401 has one end connected to the conductive structures 400 and other end connected to bit line extension lines 402, where the bit line extension lines 402 are positioned in the fourth isolation structure 14 and extend along the first direction Y. By means of the bit line contact lines 401 and bit line extension lines 402, the conductive structures 400 extending along the second direction X may be changed to extend along the first direction Y, such that the gate structures 300 and the conductive structures 400 have different extension directions, thereby avoiding mutual influence between the gate structures 300 and the conductive structures 400 in the subsequent process, and preventing performance degradation of the semiconductor structure.

Referring to FIG. 15, in some embodiments, the semiconductor structure further includes: capacitor contact spacers 15 covering the surface of the fourth isolation structure 14 and surfaces of the bit line extension lines 402; capacitor contact structures 501 positioned in the plurality of second trenches 102 and extending along the third direction Z, where an angle between the third direction Z and a plane where the first direction Y and the second direction X are positioned is greater than 0°, and along the first direction Y, the capacitor contact structures 501 and the conductive structures 400 are alternately arranged; and capacitor structures positioned on surfaces of the capacitor contact structures 501. The coupling between the capacitor and the transistor is implemented through the capacitor contact structures 501. In addition, on the surfaces of the capacitor contact structures 501, the capacitor structures may be in a hexagonal closest-packed arrangement in the first direction and the second direction to increase the space utilization of the semiconductor structure, thereby increasing the integration density of the semiconductor structure.

In some embodiments, materials of the capacitor contact structures 501 may be at least one of metal silicide, titanium, tantalum, copper, polysilicon, tungsten, tantalum nitride, titanium nitride or ruthenium.

In the semiconductor structure provided by the present disclosure, by using the method for fabricating a semiconductor structure in the above-mentioned embodiments, transistors having a gate-all-around gate structure are formed, and transistors in the same row share the same gate structure, which simplifies the fabrication processes of the semiconductor structure and improves the integration density of the semiconductor structure. Furthermore, the gate-all-around gate structures increases the contact area between the channel regions of the transistors, and improves capability of the transistors in controlling the current, thereby improving the service performance of the semiconductor structure. Along the second direction, adjacent two rows of transistors are commonly coupled to the same conductive structure. That is, the adjacent two rows of transistors share the same bit line. In this way, the fabrication processes of the semiconductor structure can be simplified, the space utilization of the semiconductor structure may be increased, and the integration density of the semiconductor structure is further increased.

Those of ordinary skill in the art can understand that the above-mentioned embodiments are some embodiments for realizing the present disclosure, but in practical applications, various changes may be made to them in form and details without departing from the spirit and scope of the present disclosure.

What is claimed is:
1. A method for fabricating a semiconductor structure, comprising:
provide a substrate, the substrate being provided with a plurality of first trenches extending along a first direction and a plurality of second trenches extending along a second direction, and a depth of each of the plurality of first trenches being less than a depth of each of the plurality of second trenches;

forming a first isolation structure to cover the substrate and fill the plurality of first trenches and the plurality of second trenches;

forming a plurality of third trenches, the plurality of third trenches being positioned in the substrate at bottoms of the plurality of first trenches and extending along the first direction;

forming a second isolation structure to fill the plurality of first trenches and the plurality of third trenches;

forming gate structures, the gate structures surrounding the substrate between the plurality of first trenches along the second direction, and in the first direction, projections of the gate structures and projections of the plurality of second trenches being parallel to one another and alternately arranged at intervals;

forming conductive structures, the conductive structures being positioned in the plurality of second trenches, and in the first direction, the conductive structures being arranged at intervals in the plurality of second trenches.

2. The method for fabricating a semiconductor structure according to claim 1, wherein the forming a first isolation structure comprises:

forming a first spacer, the first spacer filling the plurality of first trenches and covering a top surface of the substrate; and forming a second spacer, the second spacer filling the plurality of second trenches, and a top surface of the second spacer being flush with a top surface of the first spacer.

3. The method for fabricating a semiconductor structure according to claim 2, wherein a material for forming the first spacer is different from a material for forming the second spacer.

4. The method for fabricating a semiconductor structure according to claim 1, wherein the forming a plurality of third trenches comprises:

forming etching openings, the etching openings being positioned in the first isolation structure in the plurality of first trenches, and in the first direction, the etching openings being smaller than the plurality of first trenches in size; and forming the plurality of third trenches on a basis of the etching openings, and adjacent two of the plurality of third trenches being communicated with each other in the second direction.

5. The method for fabricating a semiconductor structure according to claim 1, wherein the forming gate structures comprises:

forming channel regions, the channel regions exposing a surface of the substrate in the plurality of first trenches and the plurality of third trenches along the second direction, and in the first direction, projections of the channel regions and the projections of the plurality of second trenches being parallel to one another and alternately arranged at intervals; and filling the channel regions to form the gate structures.

6. The method for fabricating a semiconductor structure according to claim 5, wherein after forming the channel regions and before forming the gate structures, the method further comprises: rounding the substrate between the plurality of first trenches, such that a shape of the substrate exposed between the plurality of first trenches conforms to a preset pattern.

7. The method for fabricating a semiconductor structure according to claim 6, wherein the rounding treatment is implemented on the basis of a thermal oxidation process, an etching process, and/or a hydrogen annealing treatment process.

8. The method for fabricating a semiconductor structure according to claim 6, wherein the preset pattern comprises a cylinder shape, an elliptic cylinder shape, or a polygon prism shape.

9. The method for fabricating a semiconductor structure according to claim 5, wherein after forming the channel regions and before forming the gate structures, the method further comprises: planarizing the substrate at bottoms of the channel regions.

10. The method for fabricating a semiconductor structure according to claim 5, wherein the forming the gate structures comprises:

forming a gate dielectric layer, the gate dielectric layer covering the surface of the substrate in the channel regions; and forming a gate conductive layer, the gate conductive layer filling voids between the substrates in the channel regions.

11. The method for fabricating a semiconductor structure according to claim 1, wherein after forming the gate structures and before forming the conductive structures, the method further comprises: forming a third isolation structure, the third isolation structure covering top surfaces of the gate structures and having a top flush with a top surface of the first isolation structure.

12. The method for fabricating a semiconductor structure according to claim 1, wherein the forming conductive structures comprises:

patterning the first isolation structure and the second isolation structure to expose the plurality of second trenches at intervals in the first direction; and filling the plurality of second trenches to form the conductive structures.

13. The method for fabricating a semiconductor structure according to claim 1, wherein a material for forming the conductive structures comprises at least one of a metal silicide, copper, or tungsten.

14. The method for fabricating a semiconductor structure according to claim 1, wherein an angle between the first direction and the second direction is greater than 0°.

15. The method for fabricating a semiconductor structure according to claim 1, wherein after forming the conductive structures, the method further comprises:

forming a fourth isolation structure, the fourth isolation structure covering a surface of the first isolation structure, a surface of the second isolation structure, surfaces of the gate structures, and surfaces of the conductive structures; and forming a plurality of bit line contact lines, the plurality of bit line contact lines being positioned in the fourth isolation structure and extending along a third direction, each of the plurality of bit line contact lines having one end connected to the conductive structures and other end connected to bit line extension lines, and the bit line extension lines being positioned in the fourth isolation structure and extending along the first direction.

16. The method for fabricating a semiconductor structure according to claim 15, wherein an angle between the third direction and a plane where the first direction and the second direction are positioned is greater than 0°.

17. The method for fabricating a semiconductor structure according to claim 15, wherein after forming the conductive structures, the method further comprises:

forming capacitor contact spacers, the capacitor contact spacers covering a surface of the fourth isolation structure and surfaces of the bit line extension lines;

forming capacitor contact structures, the capacitor contact structures being positioned in the plurality of second trenches and the capacitor contact spacers and extending along the third direction, and the capacitor contact structures and the conductive structures being alternately arranged in the first direction; and forming capacitor structures, the capacitor structures being positioned on top surfaces of the capacitor contact structures.

18. A semiconductor structure, fabricated by means of the method for fabricating the semiconductor structure according to claim 1, comprising:

a substrate, the substrate being provided with a plurality of first trenches extending along the first direction, a plurality of second trenches extending along the second direction, and a plurality of third trenches extending along the first direction, wherein a depth of each of the plurality of first trenches is less than a depth of each of the plurality of second trenches, and the plurality of third trenches are positioned in the substrate at the bottoms of the plurality of first trenches;

gate structures surrounding the substrate between the plurality of first trenches along the second direction, in the first direction, projections of the gate structures and projections of the plurality of second trenches being parallel to one another and alternately arranged at intervals;

conductive structures positioned in the plurality of second trenches, along the first direction, the conductive structures being arranged at intervals in the plurality of second trenches;

a first isolation structure configured to fill the plurality of first trenches and the plurality of second trenches between the gate structures and the conductive structures; and a second isolation structure configured to fill the plurality of first trenches and the plurality of third trenches between the gate structures and the conductive structures.

19. The semiconductor structure according to claim 18, wherein the gate structure comprises:

a gate dielectric layer covering a surface of the substrate in the plurality of first trenches and the plurality of third trenches; and a gate conductive layer covering a surface of the gate dielectric layer and filling the plurality of first trenches and the plurality of third trenches.

20. The semiconductor structure according to claim 18, further comprising:

a fourth isolation structure covering a surface of the first isolation structure, a surface of the second isolation structure, surfaces of the gate structures, and surfaces of the conductive structures; and a plurality of bit line contact lines, the plurality of bit line contact lines being positioned in the fourth isolation structure and extending along the third direction, each of the plurality of bit line contact lines having one end connected to the conductive structures and other end connected to bit line extension lines, and the bit line extension lines being positioned in the fourth isolation structure and extending along the first direction.

* * * * *